United States Patent
Pintault et al.

(10) Patent No.: US 11,952,680 B2
(45) Date of Patent: Apr. 9, 2024

(54) METHOD FOR MANUFACTURING A SINGLE CRYSTAL BY SOLUTION GROWTH ENABLING TRAPPING OF PARASITIC CRYSTALS

(71) Applicant: COMMISSARIAT A L'ENERGIE ATOMIQUE ET AUX ENERGIES ALTERNATIVES, Paris (FR)

(72) Inventors: Bruno Pintault, Monts (FR); Christian Belouet, Sceaux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 485 days.

(21) Appl. No.: 17/284,936

(22) PCT Filed: Oct. 14, 2019

(86) PCT No.: PCT/FR2019/052430
§ 371 (c)(1),
(2) Date: Apr. 13, 2021

(87) PCT Pub. No.: WO2020/079356
PCT Pub. Date: Apr. 23, 2020

(65) Prior Publication Data
US 2021/0348297 A1    Nov. 11, 2021

(30) Foreign Application Priority Data
Oct. 17, 2018   (FR) ........................... 1859610

(51) Int. Cl.
*C30B 7/00* (2006.01)
*C30B 29/14* (2006.01)
*C30B 35/00* (2006.01)

(52) U.S. Cl.
CPC ............... *C30B 7/00* (2013.01); *C30B 29/14* (2013.01); *C30B 35/007* (2013.01)

(58) Field of Classification Search
CPC .......... C30B 29/14; C30B 35/007; C30B 7/00
See application file for complete search history.

(56) References Cited

U.S. PATENT DOCUMENTS

| 5,122,224 A | 6/1992 | Montgomery et al. |
| 6,929,693 B2 * | 8/2005 | Tatartchenko ............ C30B 7/00 117/948 |

(Continued)

FOREIGN PATENT DOCUMENTS

WO    WO 2018/007729 A1    1/2018

OTHER PUBLICATIONS

International Search Report dated Jan. 29, 2020 in PCT/FR2019/052430 filed on Oct. 14, 2019, 2 pages.

(Continued)

*Primary Examiner* — Matthew J Song
(74) *Attorney, Agent, or Firm* — Oblon, McClelland, Maier & Neustadt, L.L.P.

(57) ABSTRACT

A method for manufacturing a single crystal may be by solution growth from a seed crystal, in a unit including a tank and a growth platform having a lower plate. The method may include: fastening the seed to the lower plate; introducing a crystallization solution of density $d_S$ into the tank; treating the solution in order to render it supersaturated; bringing the seed into contact with the supersaturated solution; rotating the platform until the single crystal is obtained. Before bringing the seed into contact with the supersaturated solution, the method may include forming, in the tank, of a zone for trapping parasitic crystals of density $d_C$ by introducing, into the tank, a liquid, immiscible with the growth solution, of density $d > d_S$ and $d < d_C$, which forms (Continued)

with the growth solution an interface located below the lower plate.

8 Claims, 3 Drawing Sheets

(56) References Cited

U.S. PATENT DOCUMENTS

| | | | |
|---|---|---|---|
| 8,137,442 B2 | 3/2012 | Pintault et al. | |
| 8,771,379 B2* | 7/2014 | Ibanez | C30B 7/08 |
| | | | 23/302 T |
| 10,934,632 B2 | 3/2021 | Vissie et al. | |
| 2019/0136403 A1* | 5/2019 | Qi | C30B 29/60 |
| 2019/0249329 A1* | 8/2019 | Vissie | C30B 7/14 |

OTHER PUBLICATIONS

French Preliminary Search Report (with English translation of Categories of Cited Documents), dated Sep. 9, 2019 in French Application 1859610 filed on Oct. 17, 2018, 2 pages.

\* cited by examiner

METHOD FOR MANUFACTURING A SINGLE CRYSTAL BY SOLUTION GROWTH ENABLING TRAPPING OF PARASITIC CRYSTALS

TECHNICAL FIELD

The field of the invention is that of the production of single crystals by solution growth from a seed crystal.

The invention relates more particularly to a process limiting the effects of primary or secondary nucleation in a crystal growth solution, in the context of the production of single crystals by growth in saline solution.

BACKGROUND ART

Single crystals, and in particular large single crystals of potassium dihydrogen phosphate (KDP) or deuterated potassium dihydrogen phosphate (DKDP), are obtained by crystal growth from a seed (i.e., the initial crystal from which growth begins) placed in a supersaturated solution of a salt of the same nature as the seed. Plates, cut from these large KDP and DKDP single crystals, can be used to make optical elements for power lasers for inertial confinement fusion. These optical elements are for example Pockels cells or optical elements for frequency conversion, such as frequency doublers (SHG) or triplers (THG).

In the context of the present invention, the terms "crystal growth solution", "growth solution", "crystallization solution" or simply "solution" are used interchangeably.

The evolution of a crystal immersed in a solution (solvent+solute) depends on the level of saturation of the solution. If the solution is supersaturated, i.e., if the amount of dissolved salt is greater than the equilibrium amount, the crystal grows by consumption of the excess salt in the solution. The growth rate of the crystal depends on the level of supersaturation of the solution, which can be controlled by lowering the temperature, by evaporating the solvent or by replenishing the salt in the solution. The growth rate also depends on the renewal of the solution boundary layer around the crystal. Conversely, a crystal immersed in an undersaturated solution dissolves until the amount of salt dissolved in the solution reaches the equilibrium amount. It can disappear completely.

To produce a single crystal in a crystal growth solution, a growth system is used comprising a vessel (also called a crystallizer), intended to contain the crystallization solution, and a growth platform, able to be rotated singly or alternately in the vessel. The crystal grows in the supersaturated solution on the lower tray of the growth platform.

An example of such an installation is described in document [1] and is illustrated in the attached FIG. 1. This FIG. 1 schematically represents a growth vessel 1, containing the growth solution 2, as well as a growth platform 12, suspended in the vessel by a hollow rotational shaft 3, which serves as an axis of rotation for the platform. The seed 4 is bound in the center of the lower tray 5. The lower tray 5 is connected to an upper tray 6 by pillars 7. This installation also includes a seed protection system 25, which comprises a rod 8, which is slidably mounted in the rotational shaft 3 and has, at its base, a recess 9. This recess protects the seed during the steps of under-saturation of the solution. The result of crystal growth is the crystal 10. An O-ring 11 provides sealing at the clearance between the axis of the shaft 3 and the rod 8.

During the solution growth of very large single crystals, the stability of the solution with respect to nucleation is a very important factor, because the appearance and then development of parasitic crystals in the solution reduces the growth of the main crystal, or even leads to a complete halt to its growth. Indeed, the consumption of salt in solution by a parasitic crystal reduces the mass accessible to the main crystal.

Nucleation is a process corresponding to the appearance, in the growth solution, of a new condensed phase. There are several types of nucleation, namely:

- homogeneous primary nucleation, which corresponds to the appearance of seeds within the growth solution;
- heterogeneous primary nucleation, which corresponds to the appearance of seeds on a surface in contact with the growth solution; and
- secondary nucleation, which corresponds to the appearance of seeds from crystals already present in the growth solution.

Regardless of the nature of nucleation, the appearance of parasitic crystals in the growth solution is a cause of failure when growing large single crystals.

This is the reason why many precautions are taken to avoid nucleation and the development of parasitic crystals, such as in particular:

- the choice of materials for the vessel, the platform and the optional seed protection system of the growth installation;
- the quality of the surface finish of the surfaces in contact with the growth solution;
- the carrying out of a pretreatment of the growth solution, at a temperature greater than the saturation temperature;
- the carrying out of a continuous filtration treatment external to the vessel, by sampling and re-injection of the growth solution; etc.

Despite all these precautions, nucleation can still occur.

In order to trap and dissolve the crystals resulting from nucleation in the growth solution, the authors of the document [2] propose a particular installation, illustrated in FIG. 2. Here, the vessel 13 has a particular shape with a bottom having a convexly curved peripheral part 14 and a central part 15 protruding in the form of a well. The bottom rests on a thick plate 16 of thermal insulation having a hole in which the well is inserted. A heating means 17 in the form of a coil is placed around the well in the tray and allows, during crystal growth, to maintain the well at a temperature 2 to 3° C. higher than that of the vessel 13. The combination of this central protruding well-shaped part 15, the heating means and the thermal insulation plate 16 forms, at the bottom of the vessel 13, a central crystal trap 18. Indeed, any parasitic crystals that form during growth will move toward the well due to the curvature of the bottom and get trapped there due to the higher temperature therein. In addition, the vessel 13 is placed on a tripod 19 in a container 20 filled with liquid 21.

The disadvantage of this solution is that it requires special equipment, and in particular a vessel with a bottom with a protruding part, a heating means and a thermal insulation plate.

DISCLOSURE OF THE INVENTION

The present invention aims at limiting the effects of crystal nucleation in a supersaturated growth solution, while simplifying the equipment necessary for the growth of single crystals without parasitic crystals.

This goal of the invention, as well as others that will appear in the light of the description that follows, is achieved with a process for manufacturing a single crystal by solution growth from a seed crystal, implemented using an installation comprising:

- a vessel, intended to contain the crystal growth solution;
- a growth platform, capable of being rotated in the vessel, and comprising a lower tray, on which the single crystal is intended to grow; the process comprising:
- bonding the seed crystal to the lower tray of the growth platform;
- introducing the crystallization solution into the vessel;
- treating the solution to make it supersaturated;
- bringing the seed crystal into contact with the supersaturated solution; and
- rotating the platform until the single crystal is obtained;

the process being characterized in that it further comprises, prior to bringing the seed crystal into contact with the supersaturated solution, forming, in the vessel, a trapping zone for parasitic crystals likely to grow in the crystal growth solution, by introduction, into the vessel, of a liquid immiscible with the growth solution, this liquid having a density greater than the density of the growth solution and lower than the density of the parasitic crystals and forming with the growth solution an interface which is located below the lower tray of the growth platform.

The fact, on the one hand, that one chooses to introduce a liquid which is immiscible with the crystallization solution and which has such a density and the fact, on the other hand, that the interface of the crystalline solution with the liquid is located below the lower tray on which the single crystal grows, cause the parasitic crystals to move by gravity toward the bottom of the growth vessel and remain trapped in the trapping zone, not hindering the growth of the single crystal.

It is specified that the steps of introducing the crystallization solution and the immiscible liquid can be concomitant or successive, the immiscible liquid which can be introduced before, after or at the same time as the crystallization solution. Preferably, the liquid that is immiscible with the growth solution has a chemical composition that does not allow the growth of parasitic crystals.

Advantageously, when the installation includes a seed crystal protection member, the process further comprises:

- after bonding the seed crystal to the lower tray of the growth platform, and before introducing the crystallization solution into the vessel, placing the protective member around the seed, and holding it on the lower tray of the growth platform; and
- after introducing the crystallization solution and introducing the immiscible liquid into the vessel, and before treating the solution to make it supersaturated, the operations of:
  - bringing the protective member into contact with the crystallization solution by immersion of the lower tray of the growth platform in the crystallization solution;
  - treating the crystallization solution to make it undersaturated;
  - bringing the seed into contact with the undersaturated crystallization solution by moving the protective member away from the lower tray.

The treatment steps to make the solution supersaturated or undersaturated are known to the person in the art and are not described here. If the solubility of the crystallization solution increases with temperature, these steps may for example consist of a change in the temperature of the crystallization solution, i.e., an increase in temperature to obtain an undersaturated solution or a decrease in temperature to obtain a supersaturated solution. Conversely, in the rarer case of a solute/solvent couple with decreasing solubility with temperature, the temperature will be increased to supersaturate the solution.

The crystal growth solution can for example be an aqueous medium or an organic solvent.

Advantageously, the crystal growth solution is an aqueous medium and the immiscible liquid is selected from perfluoropolyethers and perfluorocarbons.

The process according to the invention makes it possible to limit the effects of primary or secondary nucleation in a crystal growth solution, and more particularly in a crystal growth solution in an aqueous medium. The process makes it possible in particular to stop the development of parasitic seeds in a medium such as a salt supersaturated solution.

The invention also relates to the use of the manufacturing process as described above for the manufacture of a KDP or DKDP single crystal.

BRIEF DESCRIPTION OF THE DRAWINGS

The invention will be better understood and other advantages and features will appear upon reading the description that follows, given by way of non-limiting example, accompanied by the appended drawings, among which.

On all these figures, identical or similar reference marks designate identical or similar elements or sets of elements.

DETAILED DISCLOSURE OF SPECIFIC EMBODIMENTS

Figure 1:
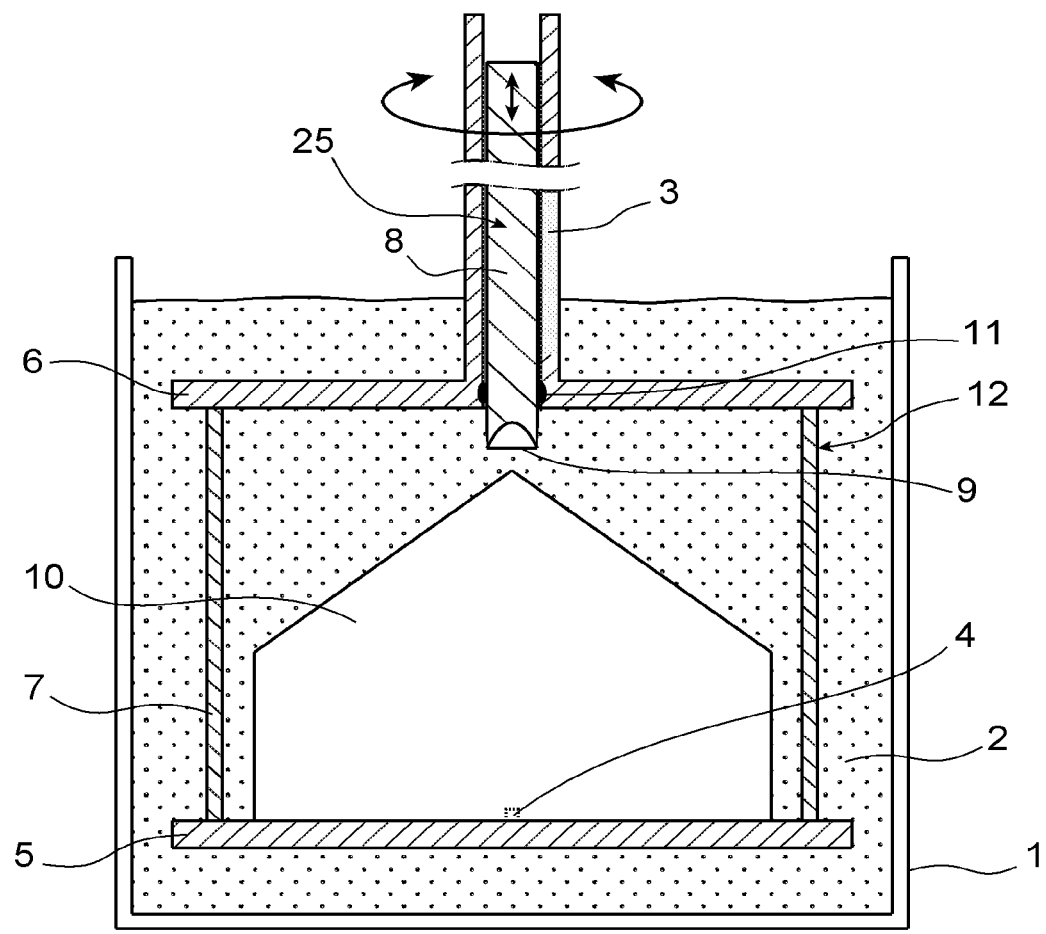
FIG. 1, already described, is a schematic view of an example of a growth installation used in the prior art.
Figure 2:
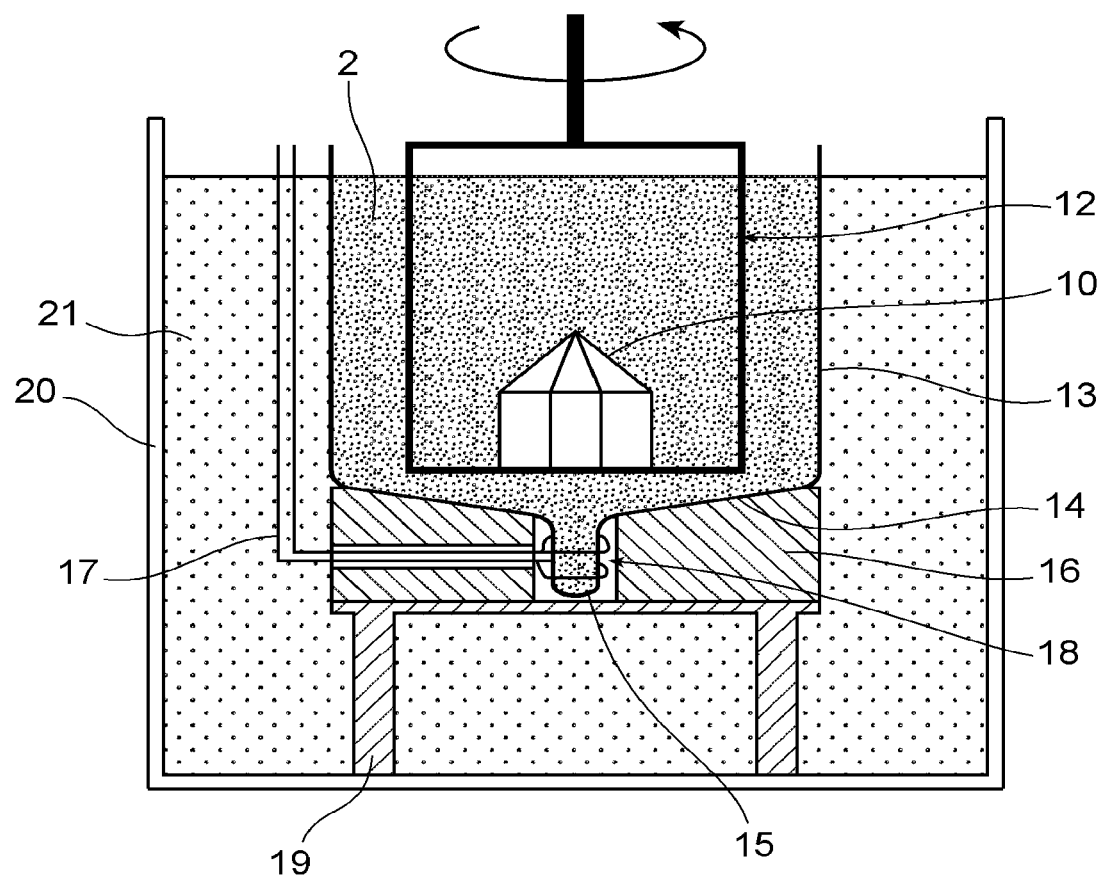
FIG. 2 is a schematic view of another example of a growth installation of the prior art, configured to limit the effects of nucleation during solution growth.
Figure 3:
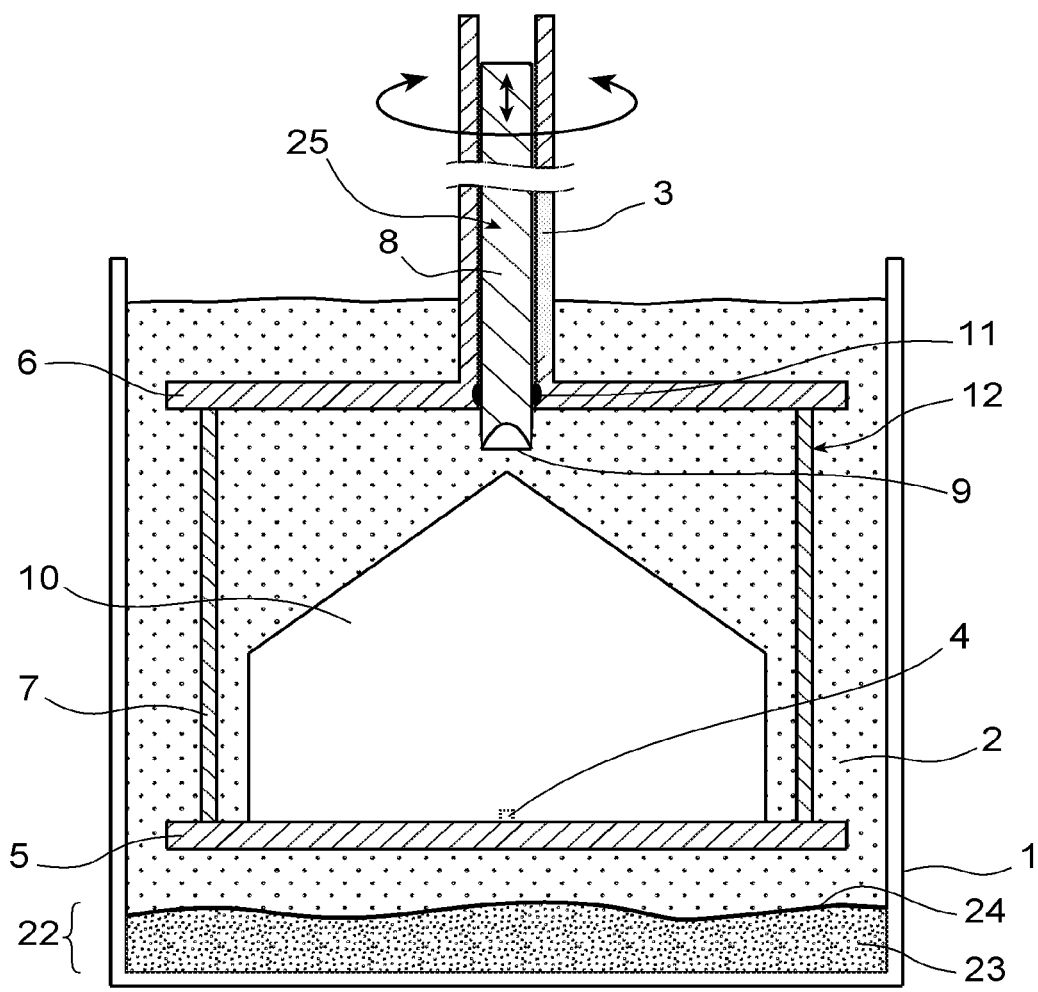
FIG. 3 is a schematic view of the growth installation illustrated in FIG. 1, implementing the manufacturing process according to the invention, in order to limit the effects of nucleation during solution growth.

An example of a growth installation with which the process according to the invention can be implemented is shown in FIG. 3. The installation is the same as the one described in FIG. 1. There is thus, in the vessel 1, a growth platform 12, a growth solution 2 and a growing crystal 10. The growth solution 2 and the growing crystal 10 form respectively a first phase (liquid) and a second phase (solid). In accordance with the process according to the invention, a liquid 21, which is immiscible with the growth solution 2, is also introduced into the vessel; thus the vessel 1 also contains a third phase (liquid), which forms a trapping zone 22 for the parasitic crystals.

The density of this immiscible liquid 21 is chosen higher than that of the growth solution 2, so that it covers the bottom of the vessel 1. Furthermore, the amount of immiscible liquid introduced into the vessel is such that the interface 24 between the immiscible liquid 21 and the growth solution 2 is located under the lower tray 5 of the growth platform.

Furthermore, the liquid 21 which is immiscible with the growth solution 2 is chosen so that its density is lower than that of the crystals resulting from nucleation, so that these crystals are trapped in this liquid by gravity.

Since the parasitic seed has a higher density than that of the growth solution, gravity carries it to the bottom of the vessel to the interface between the growth solution and the immiscible liquid. As the density of the seed is higher than that of the immiscible liquid, located at the bottom of the vessel, it crosses the interface to be trapped in the immiscible liquid, in which it no longer evolves during the further growth of the crystal on the lower tray of the platform.

The amount of immiscible liquid introduced into the vessel is a compromise between having a trapping zone with a minimum height able to trap all possible parasitic crystals and having a maximum volume of crystal solution in the vessel dedicated to the growth of the single crystal.

In rapid grow in supersaturated solution, in a growth installation for the production of very large KDP crystals for example, the seed is a cube with about 1 cm sides immersed in a growth solution of several liters, even tens or hundreds of liters. The growth installation illustrated in FIG. 3 has a seed protection member 25. To produce a single crystal in accordance with the process according to the invention, such an installation can be used.

According to an embodiment of the process in accordance with the invention, the seed crystal 4 is bonded to the lower tray 5 of the growth platform; then the protective member is placed around the seed while maintaining the stem 8 in contact with the lower tray 5 so that the seed is contained in the recess 9; then the crystallization solution 2 is introduced into the vessel; an immiscible liquid 21 is then poured into the vessel so as to form the parasitic crystal trapping zone 22; the protective member is brought into contact with the crystallization solution by immersing the lower tray (5) of the growth platform in the crystallization solution; the platform 12 is rotated; the crystallization solution is treated to make it undersaturated; the seed is brought into contact with the undersaturated crystallization solution by moving the protective member 25 away from the lower tray; before the complete disappearance of the seed, the solution is treated to make it supersaturated; the rotation of the platform in the supersaturated solution is maintained until the desired single crystal is obtained.

According to an example embodiment, to make a potassium di hydrogen phosphate (KDP) single crystal, 800 liters of KDP solution (growth solution, the solvent being water) having a density of 1.3 and 50 liters of perfluorinated polyether (PFPE) (immiscible liquid), which is immiscible with the growth solution, and has a density of the order of or greater than 1.8, are poured into a vessel. The parasite density, in the case of KDP, is of the order of 2.35. The density of the immiscible liquid is actually chosen higher than the density of the growth solution and lower than that of the parasitic crystals.

The process according to the invention has many advantages. It makes it possible to limit the effects of crystal nucleation in a supersaturated growth solution during the growth of a single crystal, without requiring any material modifications to the growth installation, and in particular to the vessel. Indeed, it allows the single crystal to continue growing despite the presence in the growth solution of a nucleation source other than the initial seed of the single crystal. Ultimately, the process according to the invention makes the manufacture of large single crystals more reliable.

The invention claimed is:

1. A process for manufacturing a single crystal by solution growth from a seed crystal, the process comprising, in an apparatus comprising a vessel configured to contain a crystal growth solution; a growth platform capable of being rotated in the vessel, and comprising a lower tray, on which the single crystal is intended to grow:
    bonding the seed crystal to the lower tray of the growth platform;
    introducing the crystal growth solution into the vessel;
    treating the crystal growth solution to make it supersaturated, to obtain a supersaturated solution,
    prior to bringing the seed crystal into contact with the supersaturated solution, forming, in the vessel, a trapping zone for parasitic crystals likely to grow in the crystal growth solution, by introducing into the vessel, an immiscible liquid, which is immiscible with the crystal growth solution, the immiscible liquid having a density greater than a density of the crystal growth solution and lower than a density of the parasitic crystals, and the immiscible liquid forming with the crystal growth solution an interface located below the lower tray of the growth platform;
    bringing the seed crystal into contact with the supersaturated solution; and
    rotating the growth platform until the single crystal is obtained.

2. The process of claim 1, wherein the immiscible liquid has a chemical composition that does not allow growth of parasitic crystals.

3. The process of claim 1, wherein the apparatus further comprises a seed crystal protection member, and
    wherein the process further comprises:
    after bonding the seed crystal to the lower tray of the growth platform, and before bringing the seed crystal into contact with the supersaturated solution, placing the seed crystal protective member around the seed crystal and holding the seed crystal on the lower tray of the growth platform; and
    after introducing the crystal growth solution and the immiscible liquid into the vessel, and before treating the crystal growth solution to make it supersaturated, comprising, successively:
    treating the crystal growth solution to make it undersaturated, to obtain an undersaturated crystallization solution;
    bringing the seed crystal protective member into contact with the undersaturated crystallization solution by immersion of the lower tray of the growth platform in the undersaturated crystallization solution; and
    bringing the seed crystal into contact with the undersaturated crystallization solution by moving the seed crystal protective member away from the lower tray.

4. The process of claim 1, wherein the crystal growth solution is an aqueous medium and the immiscible liquid comprises a perfluoropolyether, a perfluorocarbon, or a mixture of two or more of any of these.

5. The process of claim 1, wherein the single crystal is a KDP single crystal.

6. The process of claim 1, wherein the single crystal is a DKDP single crystal.

7. The process of claim 1, wherein the immiscible liquid comprises a perfluoropolyether.

8. The process of claim 1, wherein the immiscible liquid comprises a perfluorocarbon.

* * * * *